United States Patent
Fujii

(10) Patent No.: US 11,050,547 B2
(45) Date of Patent: Jun. 29, 2021

(54) RECEPTION APPARATUS, COMMUNICATION SYSTEM, AND CLOCK RECOVERY METHOD

(71) Applicant: TOSHIBA MEMORY CORPORATION, Minato-ku (JP)

(72) Inventor: Shinsuke Fujii, Ota (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/351,594

(22) Filed: Mar. 13, 2019

(65) Prior Publication Data

US 2020/0092078 A1 Mar. 19, 2020

(30) Foreign Application Priority Data

Sep. 19, 2018 (JP) .............................. JP2018-174599

(51) Int. Cl.
| | | |
|---|---|---|
| *H04L 7/033* | (2006.01) | |
| *H03K 5/156* | (2006.01) | |
| *G06F 1/10* | (2006.01) | |
| *H03K 3/017* | (2006.01) | |

(52) U.S. Cl.
CPC .............. *H04L 7/0337* (2013.01); *G06F 1/10* (2013.01); *H03K 3/017* (2013.01); *H03K 5/1565* (2013.01)

(58) Field of Classification Search
CPC ......... G06F 1/10; H04B 10/50; H04B 10/504; H04B 10/6156; H03K 3/012; H03K 3/017; H03K 3/1565; H03L 7/06; H03L 7/08; H03L 7/085; H03L 7/0802; H04L 1/20; H04L 7/00; H04L 7/02; H04L 7/033; H04L 7/0041; H04L 7/0337; H04L 27/22
USPC ........ 327/147, 156, 158, 161; 375/226, 233, 375/340, 355, 357, 371, 376
See application file for complete search history.

(56) References Cited

U.S. PATENT DOCUMENTS

| | | | |
|---|---|---|---|
| 9,276,733 B1 | 3/2016 | Oku | |
| 9,407,424 B1 * | 8/2016 | Holla | ..................... H04L 7/0337 |
| 9,680,631 B2 | 6/2017 | Tsunoda | |

(Continued)

FOREIGN PATENT DOCUMENTS

| | | |
|---|---|---|
| JP | 2015-149668 | 8/2015 |
| JP | 2016-051908 | 4/2016 |

(Continued)

*Primary Examiner* — Shawkat M Ali
(74) *Attorney, Agent, or Firm* — Oblon, McClelland, Maier & Neustadt, L.L.P.

(57) ABSTRACT

According to one embodiment, there is provided a reception apparatus including a preamplifier and a clock recovery circuit. The preamplifier is configured to receive data through a wired transmission path. The clock recovery circuit is configured to sample a value during an edge period and a value during a data period, which are in data received from the preamplifier, by using a reference clock, to execute a phase adjustment to the reference clock with respect to a transition timing of a signal level of the data in a case sampling results is satisfied a particular condition concerning a transition of the signal level of the data, and to execute no phase adjustment to the reference clock with respect to the transition timing of the signal level of the data in a case the sampling results is not satisfied the particular condition.

18 Claims, 11 Drawing Sheets

(56) References Cited

U.S. PATENT DOCUMENTS

| | | | | |
|---|---|---|---|---|
| 2006/0062341 A1* | 3/2006 | Edmondson | ............ | H03L 7/107 |
| | | | | 375/376 |
| 2007/0253475 A1* | 11/2007 | Palmer | .................... | H04L 27/01 |
| | | | | 375/229 |
| 2011/0235459 A1* | 9/2011 | Ware | .................... | G11C 7/1051 |
| | | | | 365/233.11 |
| 2013/0148704 A1* | 6/2013 | Shinmyo | ........... | H04L 25/03019 |
| | | | | 375/219 |
| 2014/0286381 A1* | 9/2014 | Shibasaki | ............... | H03L 7/089 |
| | | | | 375/226 |
| 2015/0229314 A1 | 8/2015 | Hata | | |
| 2016/0065316 A1* | 3/2016 | Tsunoda | ............... | H04B 10/541 |
| | | | | 398/155 |
| 2018/0241540 A1 | 8/2018 | Shibasaki | | |

FOREIGN PATENT DOCUMENTS

| | | |
|---|---|---|
| JP | 2016-066948 | 4/2016 |
| JP | 2018-137551 | 8/2018 |

\* cited by examiner

FIG.3A

| D<br>[n-2] | D<br>[n-1] | E<br>[n] | D<br>[n] | EARLY<br>[n] | LATE<br>[n] |
|---|---|---|---|---|---|
| 0 | 0 | 1 | X | 1 | 0 |
| 0 | 0 | 0 | 1 | 0 | 1 |
| others | | | | 0 | 0 |

FIG.3B

| D<br>[n-2] | D<br>[n-1] | E<br>[n] | D<br>[n] | EARLY<br>[n] | LATE<br>[n] |
|---|---|---|---|---|---|
| 1 | 1 | 0 | X | 1 | 0 |
| 1 | 1 | 1 | 0 | 0 | 1 |
| others | | | | 0 | 0 |

FIG.3C

| D<br>[n-2] | D<br>[n-1] | E<br>[n] | D<br>[n] | EARLY<br>[n] | LATE<br>[n] |
|---|---|---|---|---|---|
| 0 | 1 | 1 | 0 | 0 | 1 |
| 0 | 1 | 0 | X | 1 | 0 |
| others | | | | 0 | 0 |

FIG.3D

| D<br>[n-2] | D<br>[n-1] | E<br>[n] | D<br>[n] | EARLY<br>[n] | LATE<br>[n] |
|---|---|---|---|---|---|
| 1 | 0 | 0 | 1 | 0 | 1 |
| 1 | 0 | 1 | X | 1 | 0 |
| others | | | | 0 | 0 |

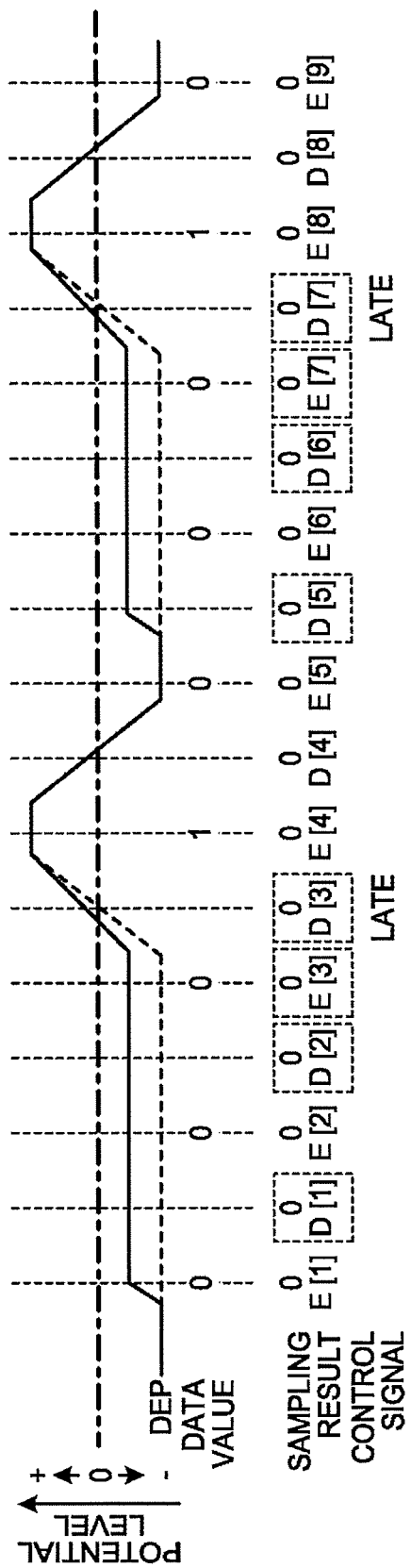

FIG.5A

| D [n-1] | E [n] | D [n] | D [n+1] | EARLY [n-1] | LATE [n-1] |
|---|---|---|---|---|---|
| X | 1 | 0 | 0 | 0 | 1 |
| 1 | 0 | 0 | 0 | 1 | 0 |
| others | | | | 0 | 0 |

FIG.5B

| D [n-1] | E [n] | D [n] | D [n+1] | EARLY [n-1] | LATE [n-1] |
|---|---|---|---|---|---|
| X | 0 | 1 | 1 | 0 | 1 |
| 0 | 1 | 1 | 1 | 1 | 0 |
| others | | | | 0 | 0 |

FIG.5C

| D [n-1] | E [n] | D [n] | D [n+1] | EARLY [n-1] | LATE [n-1] |
|---|---|---|---|---|---|
| X | 0 | 1 | 0 | 0 | 1 |
| 0 | 1 | 1 | 0 | 1 | 0 |
| others | | | | 0 | 0 |

FIG.5D

| D [n-1] | E [n] | D [n] | D [n+1] | EARLY [n-1] | LATE [n-1] |
|---|---|---|---|---|---|
| X | 1 | 0 | 1 | 0 | 1 |
| 1 | 0 | 0 | 1 | 1 | 0 |
| others | | | | 0 | 0 |

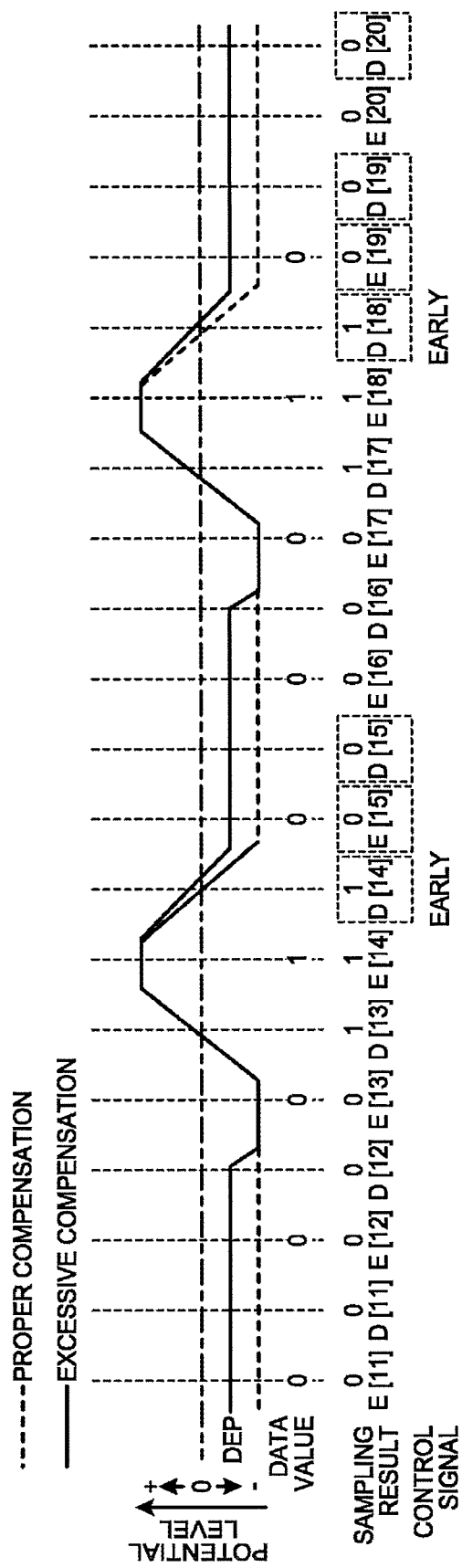

FIG.7A

| D [n-2] | D [n-1] | E [n] | D [n] | D [n+1] | EARLY [n] | LATE [n] |
|---|---|---|---|---|---|---|
| 0 | 0 | 0 | 1 | 0 | 0 | 1 |
| 0 | 0 | 1 | 1 | 0 | 1 | 0 |
| 1 | 1 | 1 | 0 | 1 | 0 | 1 |
| 1 | 1 | 0 | 0 | 1 | 1 | 0 |
| others | | | | | 0 | 0 |

FIG.7B

| D [n-2] | D [n-1] | E [n] | D [n] | D [n+1] | EARLY [n] | LATE [n] |
|---|---|---|---|---|---|---|
| 0 | 0 | 0 | 1 | 1 | 0 | 1 |
| 0 | 0 | 1 | 1 | 1 | 1 | 0 |
| 1 | 1 | 1 | 0 | 0 | 0 | 1 |
| 1 | 1 | 0 | 0 | 0 | 1 | 0 |
| others | | | | | 0 | 0 |

FIG.7C

| D [n-2] | D [n-1] | E [n] | D [n] | D [n+1] | EARLY [n] | LATE [n] |
|---|---|---|---|---|---|---|
| 1 | 0 | 0 | 1 | 0 | 0 | 1 |
| 1 | 0 | 1 | 1 | 0 | 1 | 0 |
| 0 | 1 | 1 | 0 | 1 | 0 | 1 |
| 0 | 1 | 0 | 0 | 1 | 1 | 0 |
| others | | | | | 0 | 0 |

FIG.7D

| D [n-2] | D [n-1] | E [n] | D [n] | D [n+1] | EARLY [n] | LATE [n] |
|---|---|---|---|---|---|---|
| 1 | 0 | 0 | 1 | 1 | 0 | 1 |
| 1 | 0 | 1 | 1 | 1 | 1 | 0 |
| 0 | 1 | 1 | 0 | 0 | 0 | 1 |
| 0 | 1 | 0 | 0 | 0 | 1 | 0 |
| others | | | | | 0 | 0 |

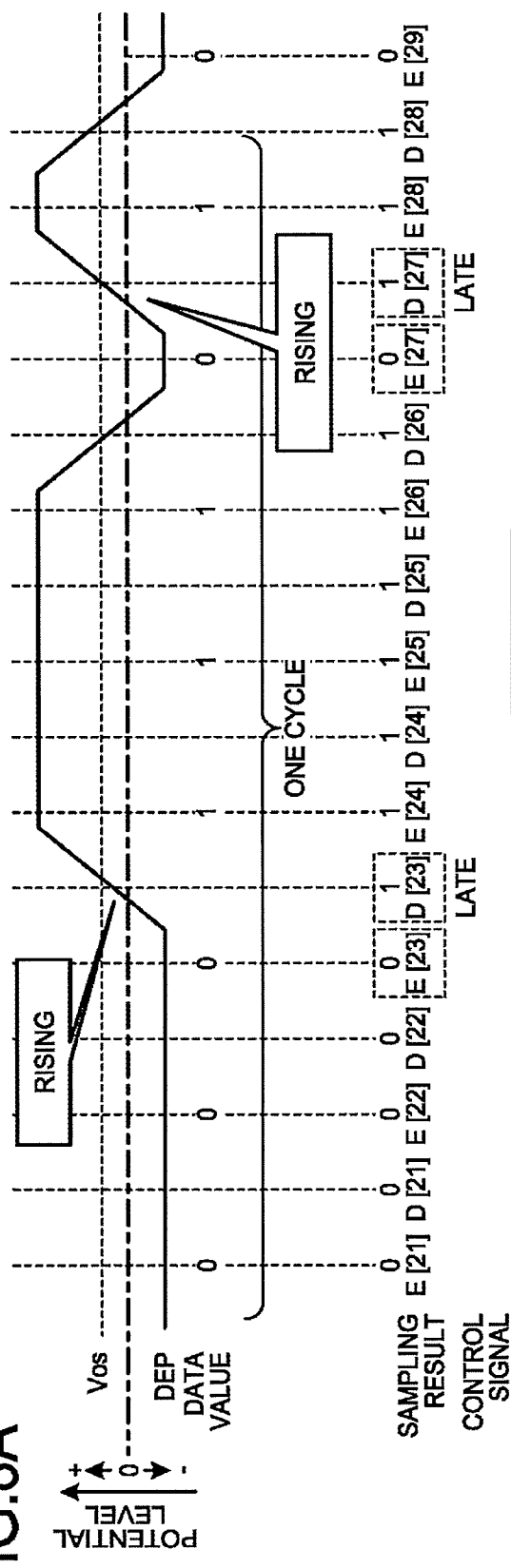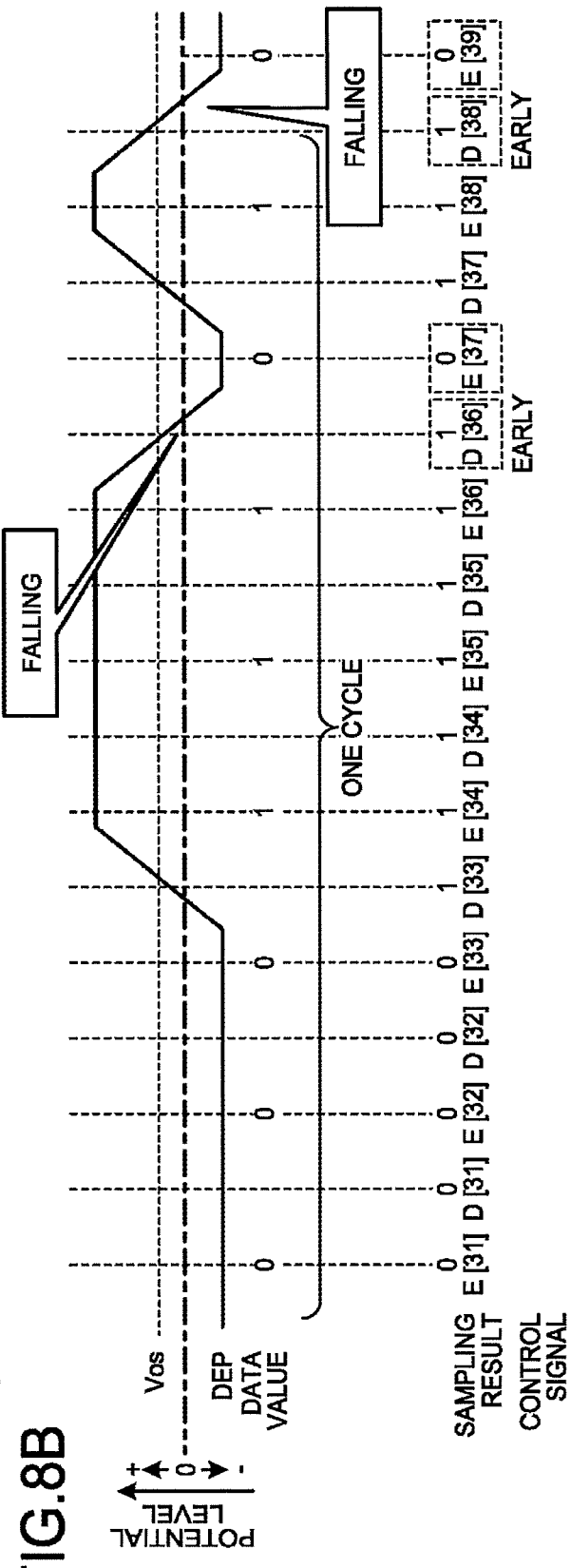

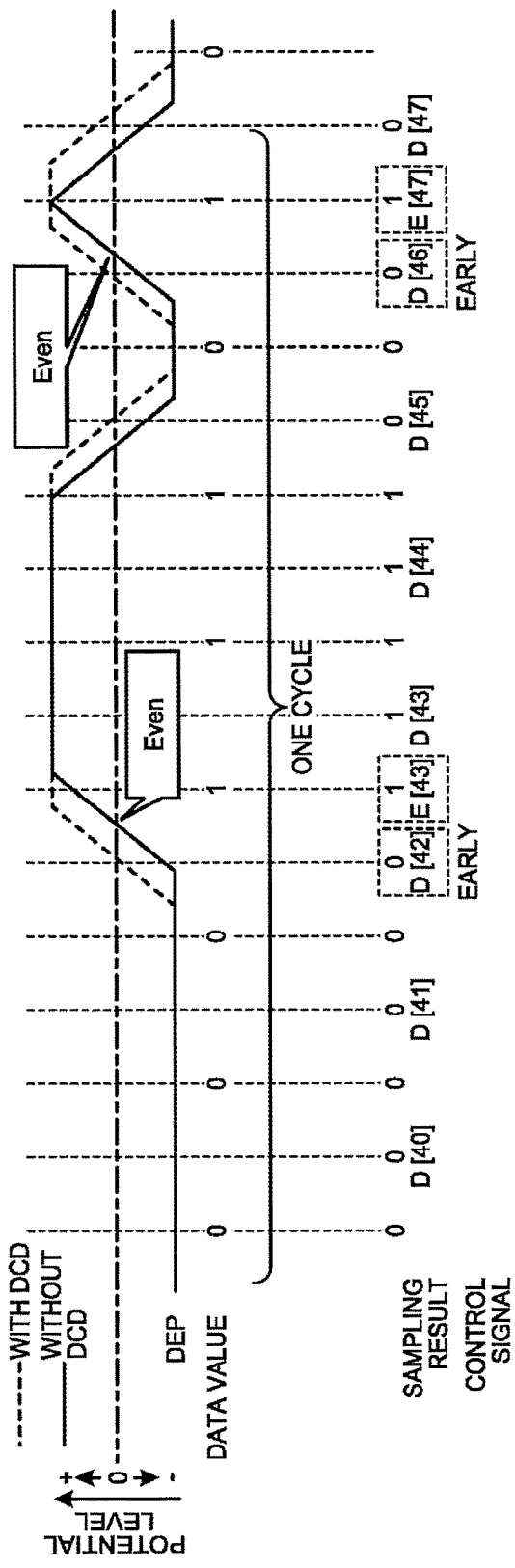
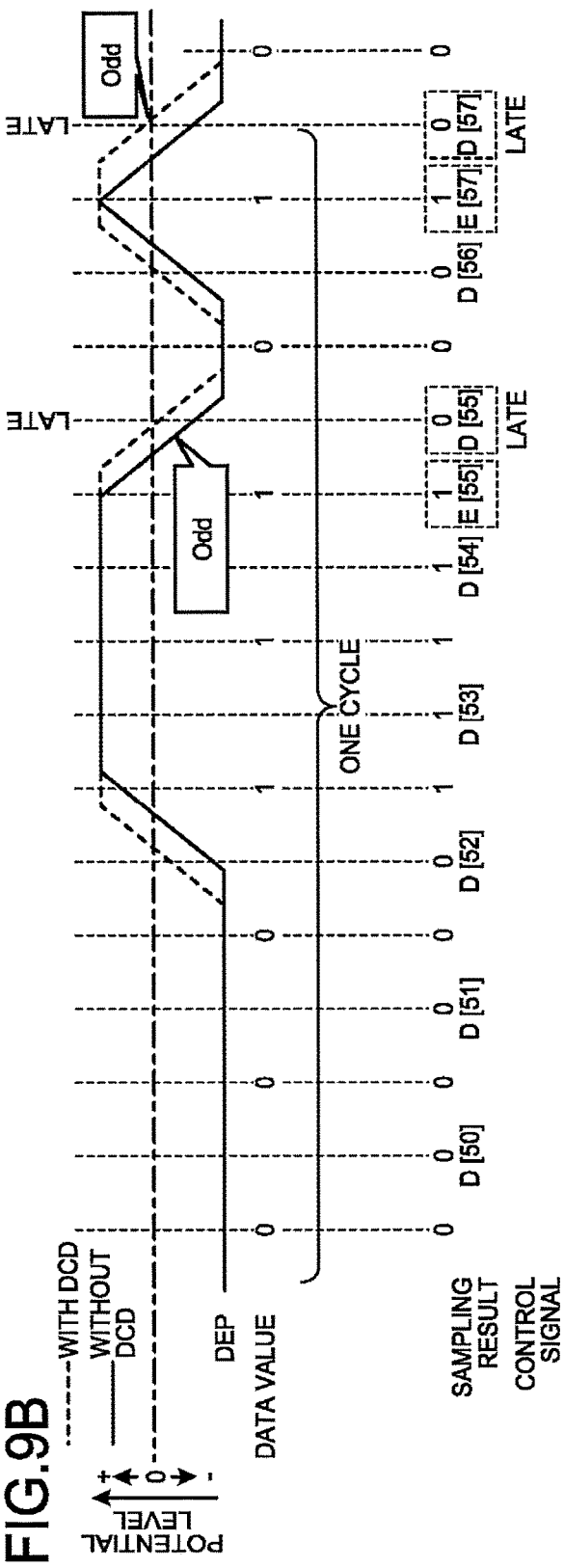
FIG.9A
FIG.9B

| D [n-2] | D [n-1] | E [n] | D [n] | EARLY [n] | LATE [n] |
|---|---|---|---|---|---|
| 0 | 0 | 1 | X | 1 | 0 |
| 0 | 0 | 0 | 1 | 0 | 1 |
| others | | | | 0 | 0 |

| | D [n-2] | D [n-1] | E [n] | D [n] | EARLY [n] | LATE [n] |
|---|---|---|---|---|---|---|
| "n" IS ODD NUMBER | 0 | 0 | 1 | X | 1 | 0 |
| "n" IS ODD NUMBER | 0 | 0 | 0 | 1 | 0 | 1 |
| others | | | | | 0 | 0 |

| E [n-1] | D [n] | E [n] | EARLY [n] | LATE [n] |
|---|---|---|---|---|
| 0 | 0 | 0 | 0 | 0 |
| 0 | 0 | 1 | 1 | 0 |
| 0 | 1 | 0 | 1 | 1 |
| 0 | 1 | 1 | 0 | 1 |
| 1 | 0 | 0 | 0 | 1 |
| 1 | 0 | 1 | 1 | 1 |
| 1 | 1 | 0 | 1 | 0 |
| 1 | 1 | 1 | 0 | 0 |

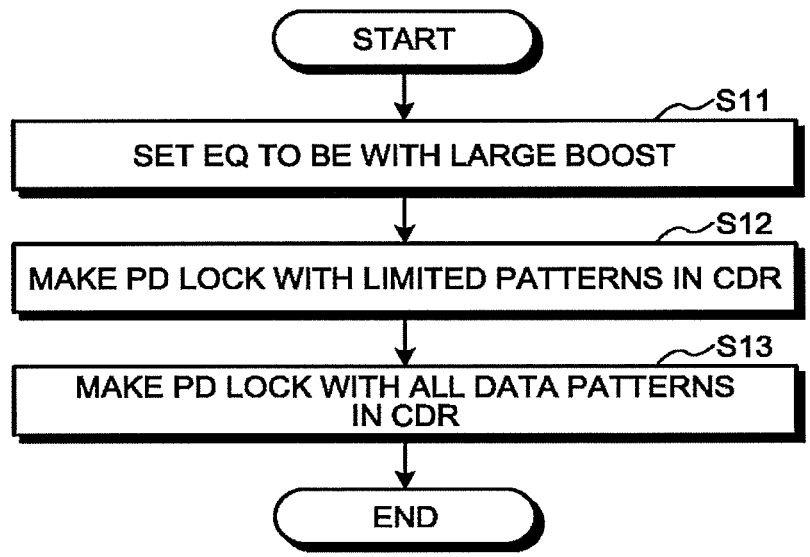
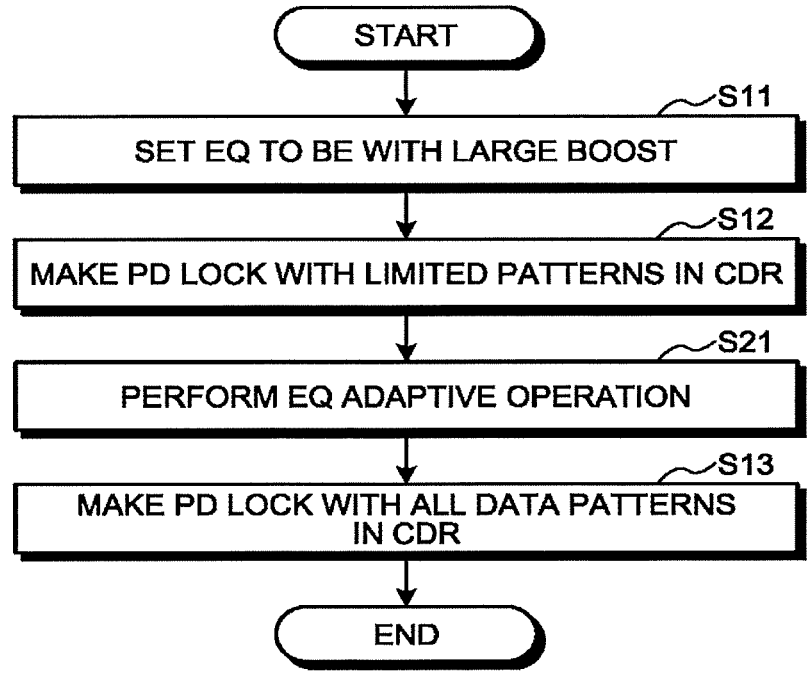

ced clock recovery circuit. The preamplifier is configured to receive data through a wired transmission path. The clock recovery circuit is configured to sample a value during an edge period and a value during a data period, which are in data received from the preamplifier, by using a reference clock. The clock recovery circuit is configured to execute a phase adjustment to the reference clock with respect to a transition timing of a signal level of the data in a case sampling results is satisfied a particular condition concerning a transition of the signal level of the data. The clock recovery circuit is configured to execute no phase adjustment to the reference clock with respect to the transition timing of the signal level of the data in a case the sampling results is not satisfied the particular condition.

Exemplary embodiments of a reception apparatus will be explained below in detail with reference to the accompanying drawings. The present invention is not limited to the following embodiments.

RECEPTION APPARATUS, COMMUNICATION SYSTEM, AND CLOCK RECOVERY METHOD

CROSS-REFERENCE TO RELATED APPLICATIONS

This application is based upon and claims the benefit of priority from Japanese Patent Application No. 2018-174599, filed on Sep. 19, 2018; the entire contents of which are incorporated herein by reference.

FIELD

Embodiments described herein relate generally to a reception apparatus, a communication system, and a clock recovery method.

BACKGROUND

In a reception apparatus including a clock recovery circuit, recovering of a clock signal for acquiring data from a received signal is performed. At this time, it is desired to recover the clock signal properly.

BRIEF DESCRIPTION OF THE DRAWINGS

FIGS. 3A to 3D are diagrams for explaining results of a determination in the embodiment;

FIG. 4 is a waveform diagram for explaining an operation of the CDR circuit in the embodiment;

FIGS. 5A to 5D are diagrams for explaining results of a determination in a first modification of the embodiment;

FIG. 6 is a waveform diagram for explaining an operation of a CDR circuit in the first modification of the embodiment;

FIGS. 7A to 7D are diagrams for explaining results of a determination in a second modification of the embodiment;

FIGS. 8A and 8B are waveform diagrams for explaining an operation of a CDR circuit in a third modification of the embodiment;

FIGS. 9A and 9B are waveform diagrams for explaining an operation of a CDR circuit in a fourth modification of the embodiment;

FIG. 14 is a flowchart illustrating an operation sequence of a reception apparatus in the seventh modification of the embodiment; and FIG. 15 is a flowchart illustrating an operation sequence of a CDR circuit in an eighth modification of the embodiment.

DETAILED DESCRIPTION

In general, according to one embodiment, there is provided a reception apparatus including a preamplifier and a

Embodiment

Figure 1:
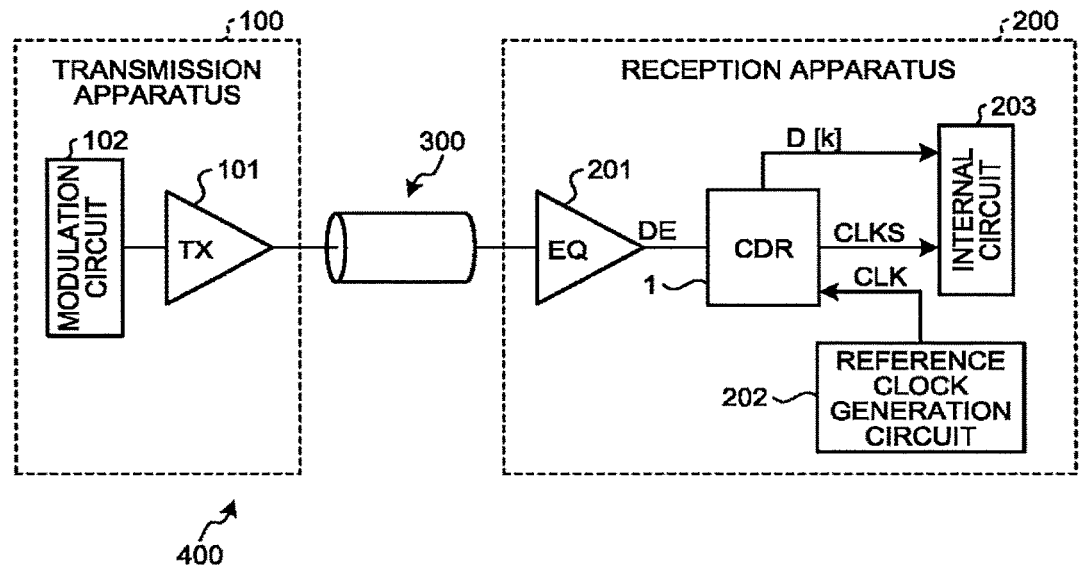
FIG. 1 is a block diagram illustrating a configuration of a communication system including a reception apparatus according to an embodiment.

A reception apparatus according to an embodiment can be implemented in a communication system for performing wired communication, for example, a communication system 400 illustrated in FIG. 1. FIG. 1 is a block diagram illustrating a configuration of the communication system 400 with a reception apparatus 200 according to the embodiment applied thereto. The communication system 400 includes a transmission apparatus 100, the reception apparatus 200, and a wired transmission path 300.

The transmission apparatus 100 and the reception apparatus 200 are mutually connected to communicate with each other through the wired transmission path 300. The transmission apparatus 100 includes a transmission circuit 101 and a modulation circuit 102. The modulation circuit 102 generates a modulation signal modulated by embedding a clock in transmission data, and supplies the modulation signal to the transmission circuit 101. The transmission circuit 101 has a function of compensating for Inter-Symbol Interference (ISI) from a precursor that is an influence received from a future signal and/or and ISI from a postcursor that is an influence received from a past signal. In this respect, the transmission circuit 101 adds a particular compensation amount to a transmission signal, and transmits a modulation signal via the wired transmission path 300 to the reception apparatus 200.

The reception apparatus 200 includes an equalizer circuit 201, a Clock Data Recovery (CDR) circuit 1, a reference clock generation circuit 202, and an internal circuit 203. The equalizer circuit 201 functions as a reception circuit and preamplifier, and receives the modulation signal from the transmission apparatus 100 via the wired transmission path 300. The equalizer circuit 201 includes a function of compensating for ISI from a precursor and/or a postcursor, and equalizes the reception signal by a particular compensation amount. The modulation signal may be deteriorated by an influence of an attenuation characteristic of the wired transmission path 300. The equalizer circuit 201 supplies an equalized signal to the CDR circuit 1 as a data signal DE. Further, the reference clock generation circuit 202 generates a reference clock CLK, and supplies the reference clock CLK to the CDR circuit 1. The CDR circuit 1 recovers a clock CLKS from the data signal DE by using the reference clock CLK, and outputs the recovered clock CLKS to the internal circuit 203. Further, the CDR circuit 1 outputs data D[k] sampled in the CDR circuit 1 to the internal circuit 203.

The internal circuit 203 is configured to perform a specific operation by using the clock CLKS and the data D[k].

The CDR circuit 1 receives each of the data signal DE and the reference clock CLK. The CDR circuit 1 samples a value at an edge portion and a value at a data portion in the data signal DE based on edges of the reference clock CLK. In a case a pattern of sampling results is a pattern indicating a transition timing of the data signal DE, the CDR circuit 1 determines whether a phase of the reference clock CLK is in a state of advance or in a state of delay. Then, in accordance with the determination result, the CDR circuit 1 adjusts the phase of the reference clock CLK, with respect to the transition timing of the data signal DE. The CDR circuit 1 may be locked in a state where edge sampling timings (i.e., timings for sampling a value at each edge portion) match the edge portions of the data signal DE, and a phase of the reference clock CLK has been properly adjusted. Consequently, a clock CLKS embed in the data signal DE can be recovered.

However, for example, in accordance with a compensation amount for a postcursor ISI in the transmission circuit 101 and the equalizer circuit 201 being excessive to the attenuation characteristic of the transmission line 300, there is a case where a determination result of the phase of the reference clock CLK, based on sampling results at two edge portions mutually adjacent in time, become opposite to each other. In this case, a determination concluded with phase advance and a determination concluded with phase delay are alternately repeated in time, and thus a phase adjustment to apply phase delaying and a phase adjustment to apply phase advancing may be alternately repeated. Consequently, a false lock could be caused that is locked in a state where the edge sampling timings do not match the edge portions of the data signal DE. If the false lock is caused, it becomes difficult to adjust the phase of the reference clock CLK properly, and becomes difficult to acquire original data from the data signal DE correctly.

In consideration of the above, according to this embodiment, the CDR circuit 1 limits a pattern of sampling results to be subjected to the determination of phase advance or phase delay with respect to sampling results, to avoid the false lock and to make proper the adjustment on the phase of the reference clock CLK.

Figure 2:
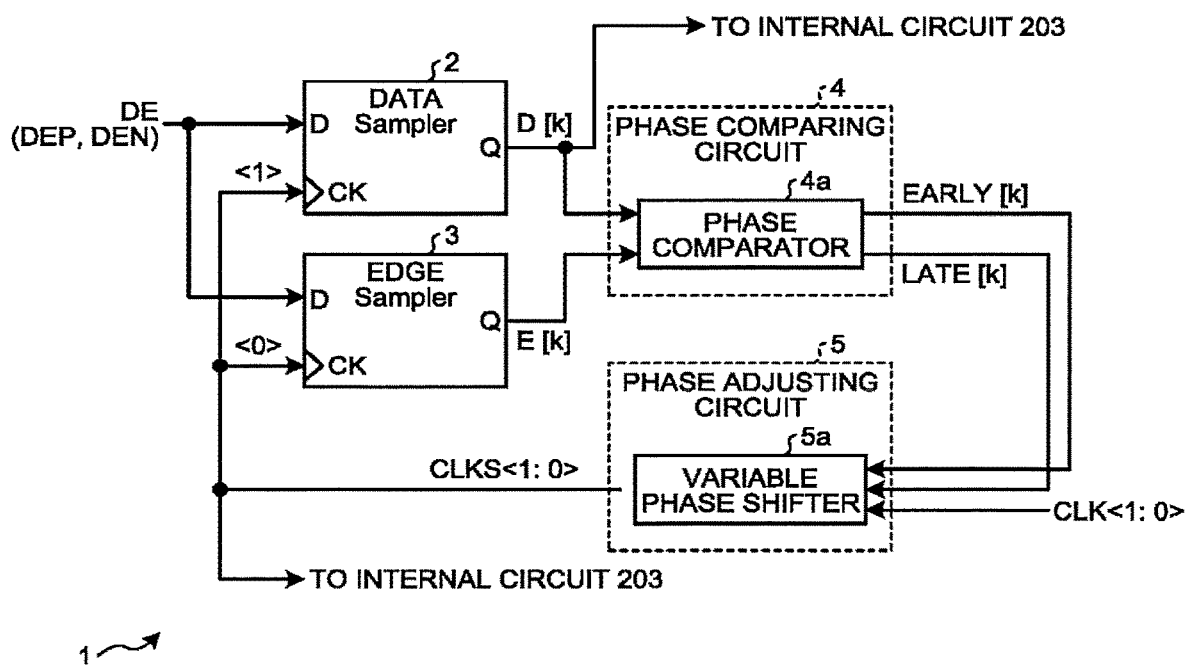
FIG. 2 is a block diagram illustrating a configuration of a Clock Data Recovery (CDR) circuit included in the reception apparatus according to the embodiment.

Specifically, the CDR circuit 1 may be configured as illustrated in FIG. 2. FIG. 2 is a diagram illustrating a configuration of the CDR circuit 1.

The CDR circuit 1 includes a data sampler 2, an edge sampler 3, a phase comparing circuit 4, and a phase adjusting circuit 5. The phase comparing circuit 4 includes a phase comparator 4a. The phase adjusting circuit 5 includes a variable phase shifter 5a.

The data sampler 2 and the edge sampler 3 are each formed of, for example, a flip-flop, and are electrically connected in parallel with each other between the equalizer circuit 201 and the phase comparing circuit 4. The data sampler 2 includes a data input terminal D electrically connected to the equalizer circuit 201, and a clock input terminal CK electrically connected to an output side of the variable phase shifter 5a. The edge sampler 3 includes a data input terminal D electrically connected to the equalizer circuit 201, and a clock input terminal CK electrically connected to the output side of the variable phase shifter 5a.

The data sampler 2 receives the data signal DE from the equalizer circuit 201, and receives a clock CLKS<1> from the variable phase shifter 5a. The data signal DE is, for example, a differential signal, and includes a P-side signal DEP and an N-side signal DEN. A clock CLKS<0> and the clock CLKS<1> are logically inverted from each other, and form a differential clock. The data sampler 2 samples a data portion in the data signal DE (i.e., the signals DEP and DEN) at a sampling timing (data sampling timing) tD[k] ("k" is an optional integer) that is synchronized with a rising edge of the clock CLKS<1>, and supplies a sampling result D[k] to the phase comparator 4a. Hereinafter, the symbol tD[k] will denote a sampling timing of a data portion, and the symbol D[k] will denote a sampling result the data portion.

The edge sampler 3 receives the data signal DE from the equalizer circuit 201, and receives a clock CLKS<0> from the variable phase shifter 5a. The edge sampler 3 samples an edge portion in the data signal DE (i.e., the signals DEP and DEN) at a sampling timing (edge sampling timing) tE[k] ("k" is an optional integer) that is synchronized with a rising edge of the clock CLKS<0>, and supplies a sampling result E[k] to the phase comparator 4a. Hereinafter, the symbol tE[k] will denote a sampling timing of an edge portion, and the symbol E[k] will denote a sampling result the edge portion.

The phase comparator 4a is arranged between the data sampler 2 and edge sampler 3 and the variable phase shifter 5a. The phase comparator 4a includes an input side electrically connected to the data sampler 2 and the edge sampler 3 in parallel, and an output side electrically connected to the variable phase shifter 5a.

The phase comparator 4a receives the sampling result E[k] from the edge sampler 3, and receives the sampling result D[k] from the data sampler 2. The phase comparator 4a may receive the sampling result E[k] and the sampling result D[k] alternately in a half clock cycle of the clock CLKS<0> or clock CLKS<1>. In accordance with time-series patterns of sampling results thus received, the phase comparator 4a determines whether an edge portion of the clock CLKS<1:0> is advanced or delayed in phase relative to an edge portion of the data signal DE. Then, in accordance with the determination result, the phase comparator 4a generates a control signal (EARLY[k], LATE[k]) that instructs phase delaying or phase advancing, and supplies the control signal to the variable phase shifter 5a.

Here, the phase comparator 4a performs the determination about phase advance or phase delay to some patterns, among all the patterns of sampling results each of which indicates a transition timing of the data signal DE, and does not perform the determination about phase advance or phase delay to the rest patterns. In accordance with the presence or absence of the determination and the determination result, the phase comparator 4a generates a control signal (EARLY[k], LATE[k]), and supplies the control signal to the variable phase shifter 5a.

For example, in accordance with sampling results (D[n−2], D[n−1], E[n], D[n])=(0,0,1,X) illustrated in FIG. 3A, the phase comparator 4a determines that the edge portion of the clock CLKS<1:0> is delayed in phase relative to the edge portion of the data signal DE. FIG. 3A is a diagram illustrating patterns of sampling results to be subjected to the determination, which are patterns of sampling results corresponding to a data pattern "001". In FIG. 3A, "n" denotes an optional integer of 3 or more. In the sampling results, "X" denotes "don't care" (an optional value). In accordance with the determination result concluded with phase delay, the phase comparator 4a generates a control signal (EARLY[n], LATE[n])=(1,0) that instructs phase advancing, and supplies the control signal to the variable phase shifter 5a.

Alternatively, in accordance with sampling results (D[n−2], D[n−1], E[n], D[n])=(0,0,0,1), the phase comparator 4a determines that the edge portion of the clock CLKS<1:0> is advanced in phase relative to the edge portion of the data signal DE. In accordance with the determination result concluded with phase advance, the phase comparator 4a generates a control signal (EARLY[n], LATE[n])=(0,1) that instructs phase delaying, and supplies the control signal to the variable phase shifter 5a.

Alternatively, in accordance with the other sampling results ("OTHERS" in FIG. 3A), the phase comparator 4a does not perform the determination about phase advance or phase delay. In accordance with that the determination is not performed (i.e., as a result without the determination), the phase comparator 4a generates a default value control signal (EARLY[n], LATE[n])=(0,0), and supplies the control signal to the variable phase shifter 5a.

In FIG. 2, the variable phase shifter 5a is arranged between the phase comparator 4a and the data sampler 2, edge sampler 3, and internal circuit 203. The variable phase shifter 5a includes an input side electrically connected to the phase comparator 4a, and an output side electrically connected to the data sampler 2, the edge sampler 3, and the internal circuit 203 in parallel.

The variable phase shifter 5a receives the control signal (EARLY[k], LATE[k]) from the phase comparator 4a, and receives a reference clock CLK<1:0> from the reference clock generation circuit 202. In accordance with the control signal (EARLY[k], LATE[k]), the variable phase shifter 5a may make a phase adjustment to shift (phase shift) the phase of the reference clock CLK<1:0> by a particular amount, while changing the shift (phase shift) direction between the phase advancing direction and the phase delaying direction. Here, the particular amount for shifting the phase (phase shift) is a phase amount smaller than the phase amount corresponding to the one cycle of the reference clock CLK (for example, smaller than the phase amount corresponding to a quarter cycle of the reference clock CLK), and may be decided by an experiment in advance.

For example, when receiving a control signal (EARLY[k], LATE[k])=(0,1) that instructs phase delaying, the variable phase shifter 5a applies phase delaying of a particular amount to the phase of the reference clock CLK<1:0>. Alternatively, when receiving a control signal (EARLY[k], LATE[k])=(1,0) that instructs phase advancing, the variable phase shifter 5a applies phase advancing of a particular amount to the phase of the reference clock CLK<1:0>. Alternatively, when receiving a control signal (EARLY[k], LATE[k])=(0,0), the variable phase shifter 5a does not adjust the phase of the reference clock CLK<1:0>.

As described above, the variable phase shifter 5a generates the clock CLKS<1:0>. Then, the variable phase shifter 5a supplies the clock CLKS<0> to the edge sampler 3, supplies the clock CLKS<1> to the data sampler 2, and outputs to the clock CLKS<1:0> to the internal circuit 203.

Here, when a compensation amount for a postcursor ISI in the transmission circuit 101 and the equalizer circuit 201 is too large for the attenuation characteristic of the transmission line, the differential signal in the data signal DE renders a waveform in a state of "excessive compensation" illustrated by the solid line in FIG. 4. FIG. 4 is a waveform diagram illustrating an operation of the CDR circuit 1, in which a potential level (0V) serving as a reference for the differential signal is indicated by a chain line. Specifically, as compared with a waveform of "proper compensation" illustrated by the broken line in FIG. 4, the amplitude of the waveform is shifted to the data value "1" side, in a period of several bits before a transition of the data value from "0" to "1".

At this time, the edge sampler 3 and the data sampler 2 respectively supply sampling results E[k] and D[k] ("k" is an integer of 1 or more and 9 or less) illustrated in FIG. 4, alternately to the phase comparator 4a. FIG. 4 illustrates a state where the edge sampling timing tE[k] does not match the edge portion timing of the differential signal.

In accordance with sampling results (D[1], D[2], E[3], D[3])=(0,0,0,1), the phase comparator 4a determines that the edge portion of the clock CLKS<1:0> is advanced in phase relative to the edge portion of the data signal DE. Then, the phase comparator 4a generates a control signal (EARLY[3], LATE[3])=(0,1) that instructs phase delaying, and supplies the control signal to the variable phase shifter 5a. In FIG. 4, a sign "LATE" is given to a point at which the active value "1" is selectively set to LATE[3] in the control signal (EARLY[3], LATE[3])=(0,1).

In accordance with the control signal (EARLY[3], LATE[3])=(0,1), the variable phase shifter 5a applies phase delaying of a particular amount to the phase of the reference clock CLK<1:0>.

Similarly, in accordance with sampling results (D[5], D[6], E[7], D[7])=(0,0,0,1), the phase comparator 4a determines that the edge portion of the clock CLKS<1:0> is advanced in phase relative to the edge portion of the data signal DE. Then, the phase comparator 4a generates a control signal (EARLY[7], LATE[7])=(0,1) that instructs phase delaying, and supplies the control signal to the variable phase shifter 5a.

In accordance with the control signal (EARLY[7], LATE[7])=(0,1), the variable phase shifter 5a applies phase delaying of a particular amount to the phase of the reference clock CLK<1:0>.

For example, it is tentatively assumed that the determination about phase advance or phase delay is performed at each of timings D[3], D[4], D[7], and D[8] where the pattern of sampling results becomes a pattern indicating a transition timing of the data signal DE. In this case, as illustrated in FIG. 4, the determination results could be sequentially concluded with phase advance, phase delay, phase advance, and phase delay at the timings D[3], D[4], D[7], and D[8]. Consequently, although the sampling timings D[3], D[4], D[7], and D[8] are in a state of disagreement with the edge portions of the signal DEP, a phase adjustment to apply phase delaying, a phase adjustment to apply phase advancing, a phase adjustment to apply phase delaying, and a phase adjustment to apply phase advancing are sequentially performed, and thus it could become difficult to come out from a false lock state.

In consideration of the above, according to this embodiment, in the CDR circuit 1, the pattern of sampling results to be subjected to the determination about phase advance or phase delay with respect to sampling results is limited. For example, in the case of FIG. 3A, the pattern of sampling results (D[n−2], D[n−1], E[n], D[n]) to be subjected to the determination is limited to (0,0,1,X) or (0,0,0,1). Consequently, a phase adjustment is performed at the timings tD[3] and tD[4], but no phase adjustment is performed at the timings tD[7] and tD[8], so that it is possible to avoid a false lock and to adjust the phase of the reference clock CLK properly.

Here, the configuration of the CDR circuit 1 is not limited to the configuration illustrated in FIG. 2, but may be formed of, for example, a PLL type configuration. For example, where the variable phase shifter 5a in FIG. 2 is replaced with a configuration in which a filter, a voltage control oscillator, and a frequency divider are connected in series, a PLL type configuration is achieved.

Further, the pattern of sampling results for the phase comparator 4a to perform the determination about phase advance or phase delay with respect to sampling results is not limited to the patterns illustrated in FIG. 3A. The pattern of sampling results for this purpose only needs to be limited to some patterns, among all the patterns of sampling results each of which indicates a transition timing of the data signal DE.

For example, the pattern of sampling results to be subjected to the determination about phase advance or phase delay may be a pattern as illustrated in FIG. 3B. The patterns illustrated in FIG. 3B correspond to those of FIG. 3A, and are patterns of sampling results with respect to the differential signal, which are patterns of sampling results corresponding to a data pattern "110". The patterns illustrated in FIG. 3B can be obtained by logically inverting the value portions of the sampling results (D[n−2], D[n−1], E[n], D[n]) illustrated in FIG. 3A. Specifically, in place of sampling to the differential signal by the patterns illustrated in FIG. 3A, the phase comparator 4a may perform sampling to the differential signal by the patterns illustrated in FIG. 3B, or may perform sampling to the differential signal by the patterns illustrated in FIGS. 3A and 3B.

Alternatively, the pattern of sampling results to be subjected to the determination about phase advance or phase delay may be a pattern as illustrated in FIG. 3C. The patterns illustrated in FIG. 3C are patterns of sampling results with respect to the differential signal, which are patterns of sampling results corresponding to a data pattern "010". Specifically, in accordance with sampling results (D[n−2], D[n−1], E[n], D[n])=(0,1,1,0), the phase comparator 4a determines that the edge portion of the clock CLKS<1:0> is advanced in phase relative to the edge portion of the data signal DE. In accordance with the determination result concluded with phase advance, the phase comparator 4a generates a control signal (EARLY[k], LATE[k])=(0,1) that instructs phase delaying, and supplies the control signal to the variable phase shifter 5a. Alternatively, in accordance with sampling results (D[n−2], D[n−1], E[n], D[n])=(0,1,0, X), the phase comparator 4a determines that the edge portion of the clock CLKS<1:0> is delayed in phase relative to the edge portion of the data signal DE. In accordance with the determination result concluded with phase delay, the phase comparator 4a generates a control signal (EARLY[k], LATE[k])=(1,0) that instructs phase advancing, and supplies the control signal to the variable phase shifter 5a. Alternatively, in accordance with the other sampling results ("OTHERS" in FIG. 3C), the phase comparator 4a does not perform the determination about phase advance or phase delay. In accordance with that the determination is not performed (i.e., as a result without the determination), the phase comparator 4a generates a default value control signal (EARLY[n], LATE[n])=(0,0), and supplies the control signal to the variable phase shifter 5a.

Alternatively, the pattern of sampling results to be subjected to the determination about phase advance or phase delay may be a pattern as illustrated in FIG. 3D. The patterns illustrated in FIG. 3D correspond to those of FIG. 3C, and are patterns of sampling results with respect to the differential signal, which are patterns of sampling results corresponding to a data pattern "101". The patterns illustrated in FIG. 3D can be obtained by logically inverting the value portions of the sampling results (D[n−2], D[n−1], E[n], D[n]) illustrated in FIG. 3C. Specifically, in place of sampling to the differential signal by the patterns illustrated in FIG. 3C, the phase comparator 4a may perform sampling to the differential signal by the patterns illustrated in FIG. 3D, or may perform sampling to the differential signal by the patterns illustrated in FIGS. 3C and 3D.

Alternatively, as a first modification of the embodiment, the CDR circuit 1 may be configured in consideration of a case where a compensation amount for a precursor ISI is excessive. In the case of a precursor ISI, a gain corresponding to a signal intensity deterioration caused by the influence received from a future signal to a modulation signal is used to compensate for a modulation signal deterioration. Here, when a compensation amount for a precursor ISI in the transmission circuit 101 and the equalizer circuit 201 is excessive for the attenuation characteristic of the transmission line, there is a case where determination results about the phase of the reference clock CLK, based on sampling results from two edge portions mutually adjacent in time, become opposite to each other. In this case, a determination concluded with phase advance and a determination concluded with phase delay are alternately repeated in time, and thus a phase adjustment to apply phase delaying and a phase adjustment to apply phase advancing are alternately repeated. Consequently, a false lock could be caused that is locked in a state where the edge sampling timing does not match the edge portions of the data signal DE.

In consideration of the above, according to the first modification of the embodiment, the pattern of sampling results to be subjected to the determination about phase advance or phase delay is limited to, for example, a pattern as illustrated in FIG. 5A. FIG. 5A is a diagram illustrating patterns of sampling results to be subjected to the determination in the first modification of the embodiment. The patterns illustrated in FIG. 5A are patterns of sampling results corresponding to a data pattern "100".

For example, in accordance with sampling results (D[n−1], E[n], D[n], D[n+1])=(X,1,0,0) illustrated in FIG. 5A, the phase comparator 4a determines that the edge portion of the clock CLKS<1:0> is advanced in phase relative to the edge portion of the data signal DE. In FIG. 5A, "n" denotes an optional integer of 1 or more. In the sampling results, "X" denotes "don't care" (an optional value). In accordance with the determination result concluded with phase advance, the phase comparator 4a generates a control signal (EARLY[n−1], LATE[n−1])=(0,1) that instructs phase delaying, and supplies the control signal to the variable phase shifter 5a.

Alternatively, in accordance with sampling results (D[n−1], E[n], D[n], D[n+1])=(1,0,0,0), the phase comparator 4a determines that the edge portion of the clock CLKS<1:0> is delayed in phase relative to the edge portion of the data signal DE. In accordance with the determination result concluded with phase delay, the phase comparator 4a generates a control signal (EARLY[n−1], LATE[n−1])=(1,0) that instructs phase advancing, and supplies the control signal to the variable phase shifter 5a.

Alternatively, in accordance with the other sampling results ("OTHERS" in FIG. 5A), the phase comparator 4a does not perform the determination about phase advance or phase delay. In accordance with that the determination is not performed (i.e., as a result without the determination), the phase comparator 4a generates a default value control signal (EARLY[n−1], LATE[n−1])=(0,0), and supplies the control signal to the variable phase shifter 5a.

Here, when a compensation amount for a precursor in the equalizer circuit 201 is too large for the attenuation characteristic of the transmission line, the differential signal in the data signal DE renders a waveform of "excessive compensation" illustrated by the solid line in FIG. 6. Specifically, as compared with a waveform of "proper compensation" illustrated by the broken line in FIG. 6, the amplitude of the waveform is shifted to the data value "1" side, in a period of several bits after a transition of the data value from "1" to "0".

At this time, the edge sampler 3 and the data sampler 2 respectively supply sampling results E[k] and D[k] ("k" is an integer of 11 or more and 20 or less) illustrated in FIG. 6, alternately to the phase comparator 4a.

In accordance with sampling results (D[14], E[15], D[15], D[16])=(1,0,0,0), the phase comparator 4a determines that the edge portion of the clock CLKS<1:0> is delayed in phase relative to the edge portion of the data signal DE. Then, the phase comparator 4a generates a control signal (EARLY[14], LATE[14])=(1,0) that instructs phase advancing, and supplies the control signal to the variable phase shifter 5a. In FIG. 6, a sign "EARLY" is given to a point at which the active value "1" is selectively set to EARLY[14] in the control signal (EARLY[14], LATE[14])=(1,0).

In accordance with the control signal (EARLY[14], LATE[14])=(1,0), the variable phase shifter 5a applies phase advancing of a particular amount to the phase of the reference clock CLK<1:0>.

Similarly, in accordance with sampling results (D[18], E[19], D[19], D[20])=(1,0,0,0), the phase comparator 4a determines that the edge portion of the clock CLKS<1:0> is delayed in phase relative to the edge portion of the data signal DE. Then, the phase comparator 4a generates a control signal (EARLY[18], LATE[18])=(1,0) that instructs phase advancing, and supplies the control signal to the variable phase shifter 5a.

In accordance with the control signal (EARLY[18], LATE[18])=(1,0), the variable phase shifter 5a applies phase advancing of a particular amount to the phase of the reference clock CLK<1:0>.

As described above, according to the first modification of the embodiment, in the CDR circuit 1, the pattern of sampling results to be subjected to the determination is limited. For example, in the case of FIG. 5A, the pattern of sampling results (D[n−1], E[n], D[n], D[n+1]) to be subjected to the determination is limited to (X,1,0,0) or (1,0,0,0). Consequently, it is possible to avoid a false lock and to adjust the phase of the reference clock CLK properly.

Alternatively, the pattern of sampling results to be subjected to the determination about phase advance or phase delay may be a pattern as illustrated in FIG. 5B. The patterns illustrated in FIG. 5B correspond to those of FIG. 5A, and are patterns of sampling results with respect to the differential signal, which are patterns of sampling results corresponding to a data pattern "011". The patterns illustrated in FIG. 5B can be obtained by logically inverting the value portions of the sampling results (D[n−1], E[n], D[n], D[n+1]) illustrated in FIG. 5A. Specifically, in place of sampling to the differential signal by the patterns illustrated in FIG. 5A, the phase comparator 4a may perform sampling to the differential signal by the patterns illustrated in FIG. 5B, or may perform sampling to the differential signal by the patterns illustrated in FIGS. 5A and 5B.

Alternatively, the pattern of sampling results to be subjected to the determination about phase advance or phase delay may be a pattern as illustrated in FIG. 5C. The patterns illustrated in FIG. 5C are patterns of sampling results with respect to the differential signal, which are patterns of sampling results corresponding to a data pattern "010". Specifically, in accordance with sampling results (D[n−1], E[n], D[n], D[n+1])=(X,0,1,0), the phase comparator 4a determines that the edge portion of the clock CLKS<1:0> is advanced in phase relative to the edge portion of the data signal DE. In FIG. 5C, "n" denotes an optional integer of 1 or more. In the sampling results, "X" denotes "don't care" (an optional value). In accordance with the determination result concluded with phase advance, the phase comparator 4a generates a control signal (EARLY[n−1], LATE[n−1])=(0,1) that instructs phase delaying, and supplies the control signal to the variable phase shifter 5a.

Alternatively, in accordance with sampling results (D[n−1], E[n], D[n], D[n+1])=(0,1,1,0), the phase comparator 4a determines that the edge portion of the clock CLKS<1:0> is delayed in phase relative to the edge portion of the data signal DE. In accordance with the determination result concluded with phase delay, the phase comparator 4a generates a control signal (EARLY[n−1], LATE[n−1])=(1,0) that instructs phase advancing, and supplies the control signal to the variable phase shifter 5a.

Alternatively, in accordance with the other sampling results ("OTHERS" in FIG. 5C), the phase comparator 4a does not perform the determination about phase advance or phase delay. In accordance with that the determination is not performed (i.e., as a result without the determination), the phase comparator 4a generates a default value control signal (EARLY[n−1], LATE[n−1])=(0,0), and supplies the control signal to the variable phase shifter 5a.

Alternatively, the pattern of sampling results to be subjected to the determination about phase advance or phase delay may be a pattern as illustrated in FIG. 5D. The patterns illustrated in FIG. 5D correspond to those of FIG. 5C, and are patterns of sampling results with respect to the differential signal, which are patterns of sampling results corresponding to a data pattern "101". The patterns illustrated in FIG. 5D can be obtained by logically inverting the value portions of the sampling results (D[n−1], E[n], D[n], D[n+1]) illustrated in FIG. 5C. Specifically, in place of sampling to the differential signal by the patterns illustrated in FIG. 5C, the phase comparator 4a may perform sampling to the differential signal by the patterns illustrated in FIG. 5D, or may perform sampling to the differential signal by the patterns illustrated in FIGS. 5C and 5D.

Alternatively, as a second modification of the embodiment, the CDR circuit 1 may be configured in consideration of a case where each of a compensation amount for a precursor ISI and a compensation amount for a postcursor ISI is excessive. Here, when a compensation amount for each of a precursor ISI and a postcursor ISI in the transmission circuit 101 and the equalizer circuit 201 is excessive for the attenuation characteristic of the transmission line, there is a case where determination results about the phase of the reference clock CLK, based on sampling results from two edge portions mutually adjacent in time, become opposite to each other. In this case, a determination concluded with phase advance and a determination concluded with phase delay are alternately repeated in time, and thus a phase adjustment to apply phase delaying and a phase adjustment to apply phase advancing are alternately repeated. Consequently, a false lock could be caused that is locked in a state where the edge sampling timing does not match the edge portions of the data signal DE.

In consideration of the above, according to the second modification of the embodiment, the pattern of sampling results to be subjected to the determination about phase advance or phase delay is limited to, for example, a pattern as illustrated in FIG. 7A. FIG. 7A is a diagram illustrating patterns of sampling results to be subjected to the determination in the second modification of the embodiment. The patterns illustrated in FIG. 7A are patterns of sampling results corresponding to data patterns "0010" and "1101".

For example, in accordance with sampling results (D[n−2], D[n−1], E[n], D[n], D[n+1])=(0,0,0,1,0) illustrated in FIG. 7A, the phase comparator 4a determines that the edge portion of the clock CLKS<1:0> is advanced in phase relative to the edge portion of the data signal DE. In FIG. 7A, "n" denotes an optional integer of 3 or more. In accordance with the determination result concluded with phase advance, the phase comparator 4a generates a control signal (EARLY[n], LATE[n])=(0,1) that instructs phase delaying, and supplies the control signal to the variable phase shifter 5a.

Alternatively, in accordance with sampling results (D[n−2], D[n−1], E[n], D[n], D[n+1])=(0,0,1,1,0), the phase comparator 4a determines that the edge portion of the clock CLKS<1:0> is delayed in phase relative to the edge portion of the data signal DE. In accordance with the determination result concluded with phase delay, the phase comparator 4a generates a control signal (EARLY[n], LATE[n])=(1,0) that instructs phase advancing, and supplies the control signal to the variable phase shifter 5a.

Alternatively, in accordance with sampling results (D[n−2], D[n−1], E[n], D[n], D[n+1])=(1,1,1,0,1), the phase comparator 4a determines that the edge portion of the clock CLKS<1:0> is advanced in phase relative to the edge portion of the data signal DE. In accordance with the determination result concluded with phase advance, the phase comparator 4a generates a control signal (EARLY[n], LATE[n])=(0,1) that instructs phase delaying, and supplies the control signal to the variable phase shifter 5a.

Alternatively, in accordance with sampling results (D[n−2], D[n−1], E[n], D[n], D[n+1])=(1,1,0,0,1), the phase comparator 4a determines that the edge portion of the clock CLKS<1:0> is delayed in phase relative to the edge portion of the data signal DE. In accordance with the determination result concluded with phase delay, the phase comparator 4a generates a control signal (EARLY[n], LATE[n])=(1,0) that instructs phase advancing, and supplies the control signal to the variable phase shifter 5a.

Alternatively, in accordance with the other sampling results ("OTHERS" in FIG. 7A), the phase comparator 4a does not perform the determination about phase advance or phase delay. In accordance with that the determination is not performed (i.e., as a result without the determination), the phase comparator 4a generates a default value control signal (EARLY[n], LATE[n])=(0,0), and supplies the control signal to the variable phase shifter 5a.

Alternatively, the pattern of sampling results to be subjected to the determination about phase advance or phase delay may be a pattern as illustrated in FIG. 7B. The patterns illustrated in FIG. 7B are patterns of sampling results corresponding to data patterns "0011" and "1100".

Alternatively, the pattern of sampling results to be subjected to the determination about phase advance or phase delay may be a pattern as illustrated in FIG. 7C. The patterns illustrated in FIG. 7C are patterns of sampling results corresponding to data patterns "1010" and "0101".

Alternatively, the pattern of sampling results to be subjected to the determination about phase advance or phase delay may be a pattern as illustrated in FIG. 7D. The patterns illustrated in FIG. 7D are patterns of sampling results corresponding to data patterns "1011" and "0100".

In any of these patterns, it is possible to instruct a phase adjustment to apply phase delaying or a phase adjustment to apply phase advancing, in accordance with a determination result concluded with phase advance or phase delay.

Alternatively, as a third modification of the embodiment, the CDR circuit 1 may be configured in consideration of a case where the output of the equalizer circuit 201 contains an offset voltage. Specifically, where the equalizer circuit 201 includes a circuit, such as a comparator, that involves an offset voltage, the output therefrom could contain an offset voltage, as illustrated in FIGS. 8A and 8B. FIGS. 8A and 8B are waveform diagrams illustrating operations of the CDR circuit 1 in the third modification of the embodiment, in which the amplitude center Vos of a differential signal is shifted to the positive side from a potential level (0V) serving as a reference for the differential signal. Under such conditions, there is a case where determination results about the phase of the reference clock CLK, based on sampling results from two edge portions mutually adjacent in time, become opposite to each other. In this case, a determination concluded with phase advance and a determination concluded with phase delay are alternately repeated in time, and thus a phase adjustment to apply phase delaying and a phase adjustment to apply phase advancing are alternately repeated. Consequently, a false lock could be caused that is locked in a state where the edge sampling timing does not match the edge portions of the data signal DE.

In consideration of the above, according to the third modification of the embodiment, the pattern of sampling results to be subjected to the determination about phase advance or phase delay is limited to, for example, a pattern as illustrated in FIG. 8A. The pattern illustrated in FIG. 8A is a pattern of sampling results corresponding to a data pattern "01". In accordance with sampling results (E[n], D[n])=(0,1) illustrated in FIG. 8A, the phase comparator 4a determines that the edge portion of the clock CLKS<1:0> is advanced in phase relative to the edge portion of the data signal DE. In accordance with the determination result concluded with phase advance, the phase comparator 4a generates a control signal (EARLY[n], LATE[n])=(0,1) that instructs phase delaying, and supplies the control signal to the variable phase shifter 5a. Here, in FIG. 8A, a sign "ONE CYCLE" is given to indicate the one cycle of the data pattern in the data signal DE.

For example, in accordance with sampling results (E[23], D[23])=(0,1), the phase comparator 4a determines that the edge portion of the clock CLKS<1:0> is advanced in phase relative to the edge portion of the data signal DE. Then, the phase comparator 4a generates a control signal (EARLY[23], LATE[23])=(0,1) that instructs phase delaying, and supplies the control signal to the variable phase shifter 5a. In FIG. 8A, a sign "LATE" is given to a point at which the active value "1" is selectively set to LATE[23] in the control signal (EARLY[23], LATE[23])=(0,1).

In accordance with the control signal (EARLY[23], LATE[23])=(0,1), the variable phase shifter 5a applies phase delaying of a particular amount to the phase of the reference clock CLK<1:0>.

Similarly, in accordance with sampling results (E[27], D[27])=(0,1), the phase comparator 4a determines that the edge portion of the clock CLKS<1:0> is advanced in phase relative to the edge portion of the data signal DE. Then, the phase comparator 4a generates a control signal (EARLY[27], LATE[27])=(0,1) that instructs phase delaying, and supplies the control signal to the variable phase shifter 5a.

In accordance with the control signal (EARLY[27], LATE[27])=(0,1), the variable phase shifter 5a applies phase delaying of a particular amount to the phase of the reference clock CLK<1:0>.

As described above, according to the third modification of the embodiment, in the CDR circuit 1, the pattern of sampling results to be subjected to the determination is limited. For example, in the case of FIG. 8A, the pattern of sampling results (E[n], D[n]) to be subjected to the determination is limited to (0,1). Consequently, it is possible to avoid a false lock and to adjust the phase of the reference clock CLK properly.

Alternatively, the pattern of sampling results to be subjected to the determination about phase advance or phase delay may be a pattern as illustrated in FIG. 8B. The pattern illustrated in FIG. 8B is a pattern of sampling results corresponding to a data pattern "10". In accordance with sampling results (D[n], E[n+1])=(1,0) illustrated in FIG. 8B, the phase comparator 4a determines that the edge portion of the clock CLKS<1:0> is delayed in phase relative to the edge portion of the data signal DE. In accordance with the determination result concluded with phase delay, the phase comparator 4a generates a control signal (EARLY[n], LATE[n])=(1,0) that instructs phase advancing, and supplies the control signal to the variable phase shifter 5a. Here, in FIG. 8B, a sign "ONE CYCLE" is given to indicate the one cycle of the data pattern in the data signal DE.

Alternatively, as a fourth modification of the embodiment, the CDR circuit 1 may be configured in consideration of a case where the output of the equalizer circuit 201 contains a Duty Cycle Distortion (DCD). Specifically, when a DCD in the output of the transmission circuit 101 remains within a waveform equalized by the equalizer circuit 201, or because of another reason, the duty ratio of the waveform could be remarkably deteriorated from the ideal value (for example, 50%), as illustrated in FIGS. 9A and 9B. FIGS. 9A and 9B are waveform diagrams illustrating operations of the CDR circuit 1 in the fourth modification of the embodiment. Under such conditions, there is a case where determination results about the phase of the reference clock CLK, based on sampling results from two edge portions mutually adjacent in time, become opposite to each other. In this case, a determination concluded with phase advance and a determination concluded with phase delay are alternately repeated in time, and thus a phase adjustment to apply phase delaying and a phase adjustment to apply phase advancing are alternately repeated. Consequently, a false lock could be caused that is locked in a state where the edge sampling timing does not match the edge portions of the data signal DE.

In consideration of the above, according to the fourth modification of the embodiment, the pattern of sampling results to be subjected to the determination about phase advance or phase delay is limited to, for example, a pattern as illustrated in FIG. 9A. The pattern illustrated in FIG. 9A is a pattern of sampling results corresponding to an even-numbered edge portion, which is a pattern including sampling results where the value at E[n] or E[n+1] is different from that at D[n] and where "n" is an even number. FIG. 9A illustrates a state where the edge sampling timing tE[k] ("k" is an optional integer) does not match the edge portion timing of the differential signal. Here, in FIG. 9A, a sign "ONE CYCLE" is given to indicate the one cycle of the data pattern in the data signal DE.

For example, in accordance with sampling results (D[42], E[43])=(0,1), the phase comparator 4a determines that the edge portion of the clock CLKS<1:0> is delayed in phase relative to the edge portion of the data signal DE. Then, the phase comparator 4a generates a control signal (EARLY[42], LATE[42])=(1,0) that instructs phase advancing, and supplies the control signal to the variable phase shifter 5a. In FIG. 9A, a sign "EARLY" is given to a point at which the active value "1" is selectively set to EARLY[42] in the control signal (EARLY[42], LATE[42])=(1,0).

In accordance with the control signal (EARLY[42], LATE[42])=(1,0), the variable phase shifter 5a applies phase advancing of a particular amount to the phase of the reference clock CLK<1:0>.

Similarly, in accordance with sampling results (D[46], E[47])=(0,1), the phase comparator 4a determines that the edge portion of the clock CLKS<1:0> is delayed in phase relative to the edge portion of the data signal DE. Then, the phase comparator 4a generates a control signal (EARLY[46], LATE[46])=(1,0) that instructs phase advancing, and supplies the control signal to the variable phase shifter 5a.

In accordance with the control signal (EARLY[46], LATE[46])=(1,0), the variable phase shifter 5a applies phase advancing of a particular amount to the phase of the reference clock CLK<1:0>.

As described above, according to the fourth modification of the embodiment, in the CDR circuit 1, the pattern of sampling results to be subjected to the determination is limited. For example, in the case of FIG. 9A, the pattern of sampling results to be subjected to the determination is limited to a pattern including sampling results where the value at E[n] or E[n+1] is different from that at D[n] and where "n" is an even number. Consequently, it is possible to avoid a false lock and to adjust the phase of the reference clock CLK properly.

Alternatively, the pattern of sampling results to be subjected to the determination about phase advance or phase delay may be a pattern as illustrated in FIG. 9B. The pattern illustrated in FIG. 9B is a pattern of sampling results corresponding to an odd-numbered edge portion, which is a pattern including sampling results where the value at E[n] or E[n+1] is different from that at D[n] and where "n" is an odd number. Here, in FIG. 9B, a sign "ONE CYCLE" is given to indicate the one cycle of the data pattern in the data signal DE.

Figures 10A, 10B, 11:
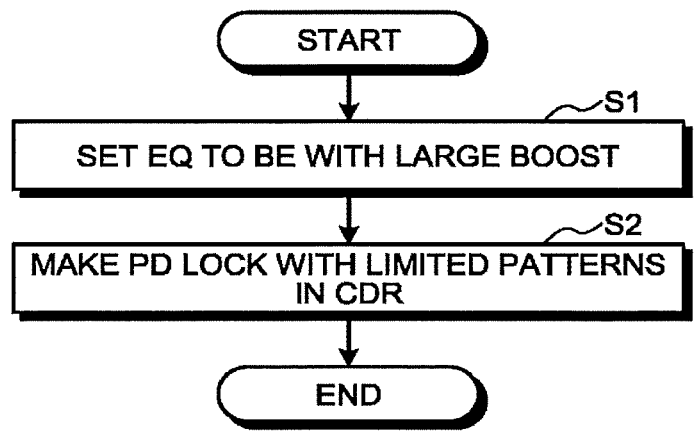
FIGS. 10A and 10B diagrams for explaining results of a determination in a fifth modification of the embodiment.
FIG. 11 is a flowchart illustrating an operation sequence of a reception apparatus in a sixth modification of the embodiment.

Alternatively, as a fifth modification of the embodiment, a plurality of ideas selected from the embodiment and the first to fourth modifications may be combined. For example, the pattern of sampling results to be subjected to the determination about phase advance or phase delay may be limited to a pattern as illustrated in FIG. 10A. FIG. 10A is a diagram illustrating patterns of sampling results to be subjected to the determination in the fifth modification of the embodiment. The patterns illustrated in FIG. 10A include the patterns illustrated in FIG. 3A according to the embodiment and the pattern illustrated in FIG. 8A according to the third modification of the embodiment. This example is configured in consideration of both of a case where a compensation amount for a postcursor ISI in the equalizer circuit 201 is excessive and a case where the output of the equalizer circuit 201 contains an offset voltage.

Alternatively, the pattern of sampling results to be subjected to the determination about phase advance or phase delay may be limited to, for example, a pattern as illustrated in FIG. 10B. FIG. 10B is a diagram illustrating patterns of sampling results to be subjected to the determination in the fifth modification of the embodiment. The patterns illustrated in FIG. 10B include the patterns illustrated in FIG. 3A according to the embodiment, the pattern illustrated in FIG. 8A according to the third modification of the embodiment, and the pattern illustrated in FIG. 9B according to the fourth modification of the embodiment. This example is configured in consideration of all of a case where a compensation amount for a precursor in the equalizer circuit 201 is excessive, a case where the output of the equalizer circuit 201 contains an offset voltage, and a case where the output of the equalizer circuit 201 contains a DCD.

Alternatively, as a sixth modification of the embodiment, the reception apparatus 200 may be operated as illustrated in FIG. 11. FIG. 11 is a flowchart illustrating an operation sequence of the reception apparatus 200 in the sixth modification of the embodiment.

When the power supply is turned on, the reception apparatus 200 sets, as the initial setting, the compensation amount in the equalizer circuit 201 to be relatively large (for example, the maximum compensation amount), and sets the equalizer circuit 201 to be with a large boost (S1). Consequently, a compensation amount for a precursor in the equalizer circuit 201 could be excessive.

Accordingly, the CDR circuit 1 limits the pattern of sampling results to be subjected to the determination about phase advance or phase delay with respect to sampling results, as described in the embodiment and the first to fifth modifications, and thereby makes a phase lock (S2). Consequently, it is possible to avoid a false lock and to adjust the phase of the reference clock CLK properly.

Figures 12, 13:
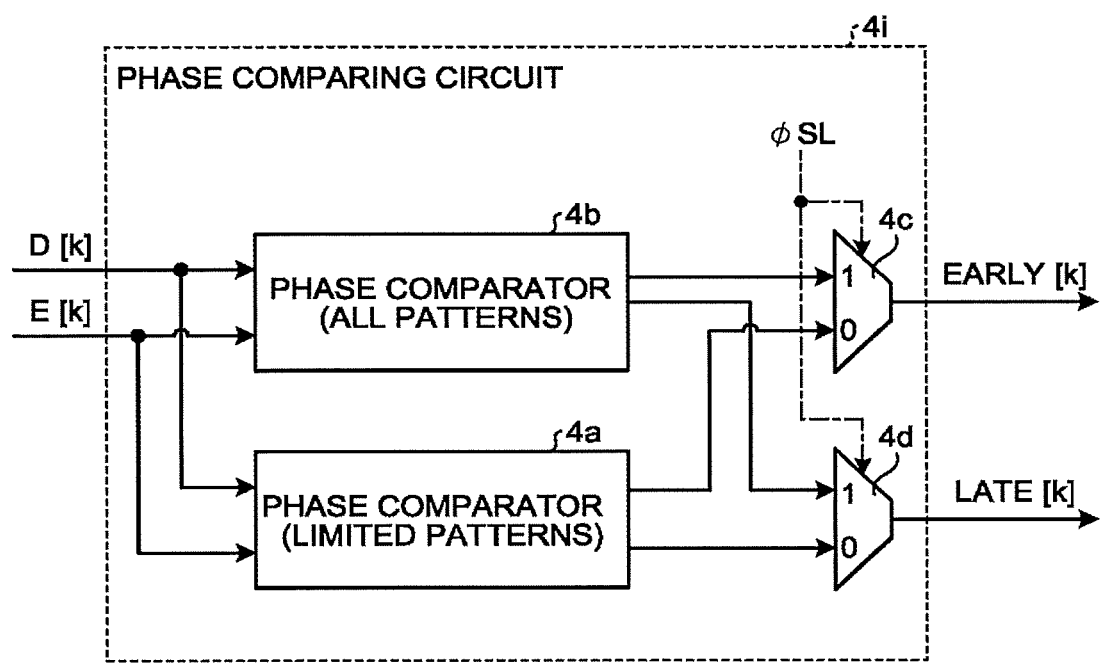
FIG. 12 is a block diagram illustrating a configuration of a phase comparing circuit in a seventh modification of the embodiment.
FIG. 13 is a diagram for explaining results of a determination in the seventh modification of the embodiment.

Alternatively, as a seventh modification of the embodiment, in place of the phase comparing circuit 4 (see FIG. 2), the CDR circuit 1 may include a phase comparing circuit 4i as illustrated in FIG. 12. FIG. 12 is a block diagram illustrating a configuration of the phase comparing circuit 4i in the seventh modification of the embodiment. The phase comparing circuit 4i includes a phase comparator 4b, a selector 4c, and a selector 4d in addition to the configuration of the phase comparing circuit 4 of FIG. 2. As illustrated in FIG. 13, the phase comparator 4b performs the determination about phase advance or phase delay to every pattern of sampling results indicating a transition timing of the data signal DE, and generates and outputs a control signal (EARLY[k], LATE[k]) (k is an optional integer of 1 or more) that instructs phase delaying or phase advancing. FIG. 13 is a diagram illustrating an operation of the CDR circuit 1 in the seventh modification of the embodiment, where "n" is an optional integer of 1 or more.

In response to a selection signal φSL=0, the selector 4c selects EARLY[k] from the phase comparator 4a, and supplies this EARLY[k] to the phase adjusting circuit 5. In response to the selection signal φSL=1, the selector 4c selects EARLY[k] from the phase comparator 4b, and supplies this EARLY[k] to the phase adjusting circuit 5.

In response to the selection signal φSL=0, the selector 4d selects LATE[k] from the phase comparator 4a, and supplies this LATE[k] to the phase adjusting circuit 5. In response to the selection signal φSL=1, the selector 4d selects LATE[k] from the phase comparator 4b, and supplies this LATE[k] to the phase adjusting circuit 5.

At this time, the reception apparatus 200 may be operated as illustrated in FIG. 14. FIG. 14 is a flowchart illustrating an operation sequence of the reception apparatus 200 in the seventh modification of the embodiment.

When the power supply is turned on, the reception apparatus 200 sets, as the initial setting, the compensation amount in the equalizer circuit 201 to be relatively large (for example, the maximum compensation amount), and sets the equalizer circuit 201 to be with a large boost (S11). Consequently, a compensation amount for a precursor in the equalizer circuit 201 could be excessive.

Accordingly, the reception apparatus 200 performs control to set the selection signal φSL=0, and the CDR circuit 1 limits the pattern of sampling results to be subjected to the determination about phase advance or phase delay with respect to sampling results, as described in the embodiment, and thereby makes a phase lock (S12). Consequently, it is possible to avoid a false lock.

After S12, when the CDR circuit 1 achieves a lock substantially properly, the reception apparatus 200 performs control to set the selection signal φSL=1, and the CDR circuit 1 performs the determination about phase advance or phase delay to every pattern of sampling results indicating a transition timing of the data signal DE, and thereby makes a phase lock (S13). Consequently, it is possible to adjust the phase of the reference clock CLK properly at a high speed, and to shorten the time easily until a lock state.

Alternatively, as an eighth modification of the embodiment, as illustrated in FIG. 15, after making a phase lock while limiting the pattern of sampling results to be subjected to the determination (S12), the reception apparatus 200 may perform an adaptive operation of adjusting the compensation amount in the equalizer circuit 201 to be a proper compensation amount (S21).

Consequently, at the time when the reception apparatus 200 performs control to set the selection signal φSL=1, and the CDR circuit 1 performs the determination about phase advance or phase delay to every pattern of sampling results indicating a transition timing of the data signal DE, and thereby makes a phase lock (S13), it is possible to achieve a lock state properly at a high speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A reception apparatus comprising:
a preamplifier configured to receive a first data through a wired transmission path; and
a clock recovery circuit configured to sample a lue during an edge period and a value during a data period, which are in a second data received from the preamplifier, by utilizing a reference clock, to execute a phase adjustment to the reference clock with respect to a transition timing of a signal level of the received second data in a case where a pattern of sampling results matches a specific pattern, the specific pattern including a pattern of at least three bits of data sampling results and one bit of an edge sampling result between the three bits of the data sampling results, sampling timing interval between one of timings to the data sampling results and a timing to the edge sampling result being smaller than sampling timing interval between adjacent two timings among the timings to the data sampling results, and to execute no phase adjustment to the reference clock with respect to the transition timing of the signal level of the received second data in a case where the pattern of the sampling results does not match the specific pattern.
2. The reception apparatus according to claim 1, wherein the specific pattern includes at least one of a pattern corresponding to that a compensation amount in the preamplifier is excessive, a pattern corresponding to that an output of the preamplifier contains an offset voltage, and a pattern corresponding to that an output of the preamplifier contains a Duty Cycle Distortion (DCD).

3. The reception apparatus according to claim 1, wherein the specific pattern includes an (n−2)-th data sampling result, an (n−1)-th data sampling result, an n-th edge sampling result, and an n-th data sampling result, where "n" is an integer of 2 or more.

4. The reception apparatus according to claim 1, wherein the specific pattern includes an (n−1)-th data sampling result, an n-th edge sampling result, an n-th data sampling result, and an (n+1)-th data sampling result, where "n" is an integer of 1 or more.

5. The reception apparatus according to claim 1, wherein the specific pattern includes a pattern of four bits of sampling results and one bit of an edge sampling result among the four bits of the data sampling results.

6. The reception apparatus according to claim 5, wherein the specific pattern includes an (n−2)-th data sampling result, an (n−1)-th data sampling result, an n-th edge sampling result, an n-th data sampling result, and an (n+1)-th data sampling result, where "n" is an integer of 2 or more.

7. The reception apparatus according to claim 1, wherein the specific pattern includes a pattern of the sampling results corresponding to one of a rising edge portion and a falling edge portion in a waveform of the received second data.

8. The reception apparatus according to claim 1, wherein the specific pattern includes a pattern of the sampling results corresponding to one of an even-numbered edge portion and an odd-numbered edge portion in a waveform of the received second data.

9. The reception apparatus according to claim 1, wherein the specific pattern includes a pattern of the sampling results corresponding to a data pattern of three bits in which 0 and 1 are mixed, and a pattern of the sampling results corresponding to one of a rising edge portion and a falling edge portion in a waveform.

10. The reception apparatus according to claim 1, wherein the specific pattern includes a pattern of the sampling results corresponding to a data pattern of three bits in which 0 and 1 are mixed, and a pattern of the sampling results corresponding to one of an even-numbered edge portion and an odd-numbered edge portion in a waveform.

11. A communication system comprising:
a transmission apparatus; and
the reception apparatus according to claim 1, to which the transmission apparatus is connected through a wired communication path.

12. The communication system according to claim 11, wherein
the specific pattern includes at least one of a pattern corresponding to that a compensation amount in the preamplifier is excessive, a pattern corresponding to that an output of the preamplifier contains an offset voltage, and a pattern corresponding to that an output of the preamplifier contains a Duty Cycle Distortion (DCD).

13. The communication system according to claim 11, wherein
the specific pattern includes at least one of a pattern of four bits of the data sampling results and one bit of an edge sampling result between the four bits of the data sampling results, a pattern of the sampling results corresponding to one of a rising edge portion and a falling edge portion in a waveform of the received second data, and a pattern of the sampling results corresponding to one of an even-numbered edge portion and an odd-numbered edge portion in a waveform of the received second data.

14. The reception apparatus according to claim 1, wherein the clock recovery circuit has a first mode and a second mode,
the clock recovery circuit is configured:
in the first mode and the second mode, to sample the value during the edge period and the value during the data period, which are in the second data received from the preamplifier, by utilizing the reference clock,
in the first mode, to execute the phase adjustment to the reference clock with respect to the transition timing of the signal level of the received second data in a case where the pattern of the sampling results matches the specific pattern and to execute no phase adjustment to the reference clock with respect to the transition timing of the signal level of the received second data in a case where the pattern of the sampling results does not match the specific pattern,
in the second mode, to execute the phase adjustment to the reference clock with respect to the transition timing of the signal level of the received second data for every sampling results.

15. A clock recovery method comprising:
receiving data;
sampling a value during an edge period and a value during a data period, which are in the received data, by utilizing a reference clock;
executing a phase adjustment to the reference clock with respect to a transition timing of a signal level of the received data in a case where a pattern of sampling results matches a specific pattern, the specific pattern including a pattern of at least three bits of data sampling results and one bit of an edge sampling result between the three bits of the data sampling results, sampling timing interval between one of timings to the data sampling results and a timing to the edge sampling result being smaller than sampling timing interval between adjacent two timing among the timings to the data sampling results; and
executing no phase adjustment to the reference clock with respect to the transition timing of the signal level of the received data in the case where a pattern of the sampling results does not match the specific pattern.

16. The dock recovery method according to claim 15, wherein
the specific pattern includes at least one of a pattern corresponding to that a compensation amount in the preamplifier is excessive, a pattern corresponding to that an output of the preamplifier contains an offset voltage, and a pattern corresponding to that an output of the preamplifier contains a Duty Cycle Distortion (DCD).

17. The clock recovery method according to claim 15, wherein
the specific pattern includes at least one of a pattern of four bits of the data sampling results and one bit of an edge sampling result between the four bits of the data sampling results, a pattern of the sampling results corresponding to one of a rising edge portion and a falling edge portion in a waveform of the received data, and a pattern of the sampling results corresponding to one of an even-numbered edge portion and an odd-numbered edge portion in a waveform of the received data.

18. The clock recovery method according to claim 15, wherein
the sampling includes in a first mode and a second mode of clock recovery, sampling the value during the edge period and the value during the data period, which are in the received data, by utilizing the reference clock,
the executing includes
in the first mode of clock recovery, executing a phase adjustment to the reference clock with respect to the transition timing of the signal level of the received data in a case where the pattern of the sampling results matches the specific pattern, and executing no phase adjustment to the reference clock with respect to the transition timing of the signal level of the received data in a case where the pattern of the sampling results does not match the specific pattern; and
in the second mode of clock recovery, executing the phase adjustment to the reference clock with respect to the transition timing of the signal level of the received data for every sampling results.

* * * * *